United States Patent
Li et al.

(10) Patent No.: US 9,905,591 B2
(45) Date of Patent: Feb. 27, 2018

(54) ARRAY SUBSTRATE COMPRISING SEPARATING REGION AND MANFACTURING METHOD THEREOF, DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Chun Li, Beijing (CN); Yanming Wang, Beijing (CN); Ruitao Song, Beijing (CN); Tao Wu, Beijing (CN); Hongwei Sun, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/787,574

(22) PCT Filed: Apr. 17, 2015

(86) PCT No.: PCT/CN2015/076917
§ 371 (c)(1),
(2) Date: Oct. 28, 2015

(87) PCT Pub. No.: WO2016/041349
PCT Pub. Date: Mar. 24, 2016

(65) Prior Publication Data
US 2016/0197100 A1   Jul. 7, 2016

(30) Foreign Application Priority Data
Sep. 16, 2014   (CN) .......................... 2014 1 0472064

(51) Int. Cl.
*H01L 27/14*   (2006.01)
*H01L 27/12*   (2006.01)
(Continued)

(52) U.S. Cl.
CPC ...... *H01L 27/127* (2013.01); *G02F 1/136259* (2013.01); *H01L 27/124* (2013.01);
(Continued)

(58) Field of Classification Search
CPC ..... H01L 27/12; G02F 1/1341; G02F 1/1335; G02F 1/1337
(Continued)

(56) References Cited

U.S. PATENT DOCUMENTS 7,211,944 B2 * 5/2007 Bae ..................... H01L 27/3246
257/40
7,851,799 B2 * 12/2010 Song ................. G02F 1/134363
257/347

(Continued)

FOREIGN PATENT DOCUMENTS

CN   1976044 A   6/2007
CN   101197332 A   6/2008
(Continued)

OTHER PUBLICATIONS

Search Report and Written Opinion dated Jul. 21, 2015 from State Intellectual Property Office of the P.R. China.
(Continued)

*Primary Examiner* — Caleb Henry
(74) *Attorney, Agent, or Firm* — Dilworth & Barrese, LLP.; Michael J. Musella, Esq.

(57) ABSTRACT

An array substrate and a manufacturing method thereof, a display apparatus are disclosed. The manufacturing method of the array substrate includes a forming a conduction layer (20) for electrically connecting two adjacent pixel electrodes
(Continued)

(104) upon forming of the pixel electrodes (104). The method further includes forming a photoresist layer (30) on a surface of a substrate with the conduction layer (20) formed thereon; through one exposure and development process, forming a first photoresist removed region (A) and a photoresist retained region (B). The first photoresist removed region (A) corresponds to a location of the conduction layer (20); the conduction layer (20) in the first photoresist removed region (A) is etched, to form a separating region (106) configured for avoiding electrical connection of pixel electrodes (104) of two adjacent pixel units; and within the separating region (106), a metal line that is non-electrically connected to adjacent two pixel electrodes (104) is formed. With the array substrate and manufacturing method thereof, damage to excessive thin film layers in the array substrate in the course of reducing bright dot defect can be avoided.

19 Claims, 10 Drawing Sheets

(51) Int. Cl.
G02F 1/1362 (2006.01)
G02F 1/1343 (2006.01)
(52) U.S. Cl.
CPC ........... G02F 2001/134372 (2013.01); G02F 2001/136272 (2013.01)
(58) Field of Classification Search
USPC .......................................................... 257/72
See application file for complete search history.

(56) References Cited

U.S. PATENT DOCUMENTS

| | | | |
|---|---|---|---|
| 2004/0043545 A1 | 3/2004 | Yoo et al. | |
| 2008/0012008 A1* | 1/2008 | Song | H01L 27/283 257/40 |
| 2009/0115925 A1* | 5/2009 | Park | G02F 1/13624 349/41 |
| 2009/0135347 A1* | 5/2009 | Jeon | G02F 1/13439 349/106 |
| 2011/0079787 A1* | 4/2011 | Choi | H01L 29/4908 257/71 |
| 2011/0241014 A1* | 10/2011 | Yoon | H01L 27/3276 257/72 |
| 2013/0083265 A1 | 4/2013 | Misaki | |
| 2014/0117360 A1* | 5/2014 | Shin | H01L 27/14609 257/59 |
| 2015/0001543 A1* | 1/2015 | Moon | H01L 27/1244 257/72 |
| 2015/0028340 A1* | 1/2015 | Iwasaka | H01L 27/1288 257/72 |
| 2015/0036071 A1* | 2/2015 | Kim | G02F 1/133512 349/43 |
| 2015/0092132 A1* | 4/2015 | Kang | H01L 27/1259 349/43 |
| 2015/0123136 A1* | 5/2015 | Kim | G02F 1/13454 257/72 |
| 2015/0213769 A1* | 7/2015 | Shin | G09G 3/3607 345/690 |
| 2015/0253628 A1* | 9/2015 | Kim | C09D 179/08 349/123 |
| 2015/0268489 A1* | 9/2015 | Lee | G02F 1/1337 349/123 |
| 2015/0287744 A1* | 10/2015 | Oh | H01L 27/127 257/72 |

FOREIGN PATENT DOCUMENTS

| | | |
|---|---|---|
| CN | 101833204 A | 9/2010 |
| CN | 201974616 U | 9/2011 |
| CN | 103985671 A | 8/2014 |
| CN | 104362152 A | 2/2015 |

OTHER PUBLICATIONS

Chinese Office Action dated Sep. 19, 2016.
Office Action dated Mar. 9, 2017.

* cited by examiner

ARRAY SUBSTRATE COMPRISING SEPARATING REGION AND MANFACTURING METHOD THEREOF,DISPLAY APPARATUS

TECHNICAL FIELD

Embodiments of the present invention relate to an array substrate and manufacturing method thereof, and a display apparatus.

BACKGROUND

Thin Film Transistor Liquid Crystal Displays (TFT-LCDs) as a kind of flat panel display apparatus are more and more applied to the high-performance display field because they have traits of small volume, low power consumption, radiation-free, relatively low production cost, etc.

A TFT-LCD includes a color filter substrate and an array substrate disposed to be aligned with each other, with a liquid crystal layer provided therebetween. By means of controlling the deflection of liquid crystal molecules in the liquid crystal layer, control of light intensity is realized, so as to achieve an objective of displaying images.

Generally, the structure of an array substrate may be as shown in FIG. 1a, and it includes a plurality of gate lines 10 and data lines 11 that crisscross over each other. A plurality of pixel units 12 arranged in the form of a matrix are defined by the crossing of the gate lines 10 and the data lines 11, and a pixel electrode 104 is provided within each of the pixel units 12. The sectional view of the array substrate taken along the A-A' direction is shown in FIG. 1b, and it includes multilayer thin film structures from bottom to top, such as, a gate electrode 101, a gate insulating layer 102, a semiconductor active layer 103, a pixel electrode 104, and a source/drain metal layer 105. For example, the above thin film structures may be fabricated in such a manner that a thin film layer and a photoresist are formed sequentially on a substrate, and then are subjected to masking, exposure, development, etching, stripping and other process.

However, during production and processing, due to the impact of external environment or production process, a thin film layer that should be etched away may be left over on the substrate. For example, the semiconductor active layer 103 or the pixel electrode 104 lying in a region between two adjacent pixel units 12 (in correspondence with a photoresist fully-removed region) should be fully etched away. However, during exposure and development, because a photoresist in the above photoresist fully-removed region is affected by the film-plating process of the former layer and its own process, the photoresist may not be fully exposed and a superfluous photoresist retained region is formed. On this basis, by a subsequent production process, it is possible that a residual portion (forming a conduction layer 20) of the pixel electrode 104 shown in FIG. 1c, or a residual portion (forming a conduction layer 20) of the semiconductor active layer 103 shown in FIG. 1d is formed between two adjacent pixel units 12. In this way, pixel electrodes 104 in two adjacent pixel units 12 are electrically connected, and when one of the pixel units 12 is controlled for display, a pixel unit 12 that is adjacent and electrically connected to it is lit up as well, resulting in occurrence of an uncontrolled bright pixel point (bright dot defect). This adversely affects the display effects and the product quality.

In order to solve the above problems, laser bonding or cutting process is generally adopted to repair a pixel point that suffers from a bright dot defect. For example, the array substrate is detected by an optical detection instrument, and when a bright dot defect is found, the above conduction layer 20 may be cut, so that two adjacent pixel units 12 are not electrically connected. However, because thickness of the pixel electrode 104 is relatively smaller, the degree of identification of the optical detection is reduced, and this leads to increasing of the miss probability of detection. And, when the above repairing process is carried out, other thin film structure that has already been formed, such as, a passivation layer, a common electrode layer or the like (not shown in the figure) located on a surface of the pixel electrode 104, may be damaged. Thus, repair effect of the bright dot defect is degraded, and quality of the product is affected.

SUMMARY

According to embodiments of the invention, there are provided an array substrate and manufacturing method thereof, and a display apparatus, capable of avoiding damage to excessive thin film layers on the array substrate in the course of reducing bright dot defects.

According to an embodiment of the invention, there is provided a method for manufacturing an array substrate, including a process for forming a plurality of pixel electrodes arranged in the form of a matrix, with a conduction layer for electrically connecting two adjacent pixel electrodes being formed upon formation of the pixel electrodes, the method further including forming a photoresist layer on a surface of a substrate with the conduction layer formed thereon; through one exposure and development process, forming a first photoresist removed region that corresponds to a location of the conduction layer and a photoresist retained region that corresponds to the other region on the surface of the substrate with the conduction layer formed thereon; etching the conduction layer in the first photoresist removed region, so as to form a separating region for avoiding electrical connection of the two adjacent pixel electrodes; and stripping the photoresist layer in the photoresist retained region; forming a metal layer on a surface of the substrate with the above structures formed thereon; through one patterning process and within the separating region, forming a metal line that is non-electrically connected to the two adjacent pixel electrodes.

According to an embodiment of the invention, there is further provided an array substrate, including a plurality of pixel electrodes arranged in the form of a matrix, a separating region for avoiding electrical connection of two adjacent pixel electrodes, and a metal line that is situated within the separating region and is non-electrically connected to the two adjacent pixel electrode.

According to an embodiment of the invention, there is further provided a display apparatus, including any of array substrates as stated above.

BRIEF DESCRIPTION OF THE DRAWINGS

In order to illustrate the technical solution of the embodiments of the invention more clearly, the drawings needed to be used in description of the embodiments or prior art will be briefly introduced below; it is obvious that the drawings as described below are only related to some embodiments of the invention. For those ordinarily skilled in the art, other drawings can also be obtained from these drawings without creative work.

REFERENCE NUMERALS

01—base substrate; 10—gate line; 11—data line (metal line); 12—pixel unit; 101—gate electrode; 102—gate insulating layer; 103—semiconductor active layer; 104—pixel electrode; 105—source/drain metal layer; 106—separating region; 1061—recess; 1062—insulating section; 107—lead hole; 108—lead; 109—passivation layer; 110—common electrode layer; 20—conduction layer; 30—photoresist layer; A—first photoresist removed region; B—photoresist retained region; C—second photoresist removed region.

DETAILED DESCRIPTION

Hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the embodiments in the invention, those ordinarily skilled in the art can obtain other embodiment(s), without any inventive work, which come(s) into the scope sought for protection by the invention.

Figure 1A:
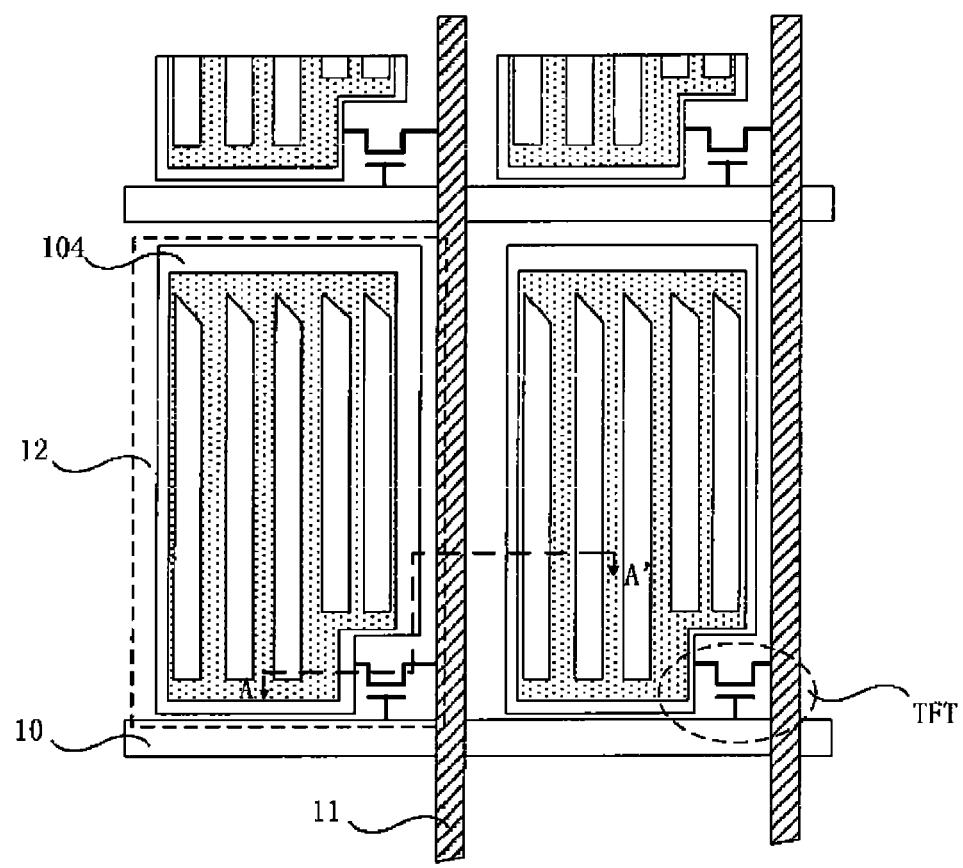
FIG. 1a is a structurally schematic view illustrating an array substrate.
Figure 2:
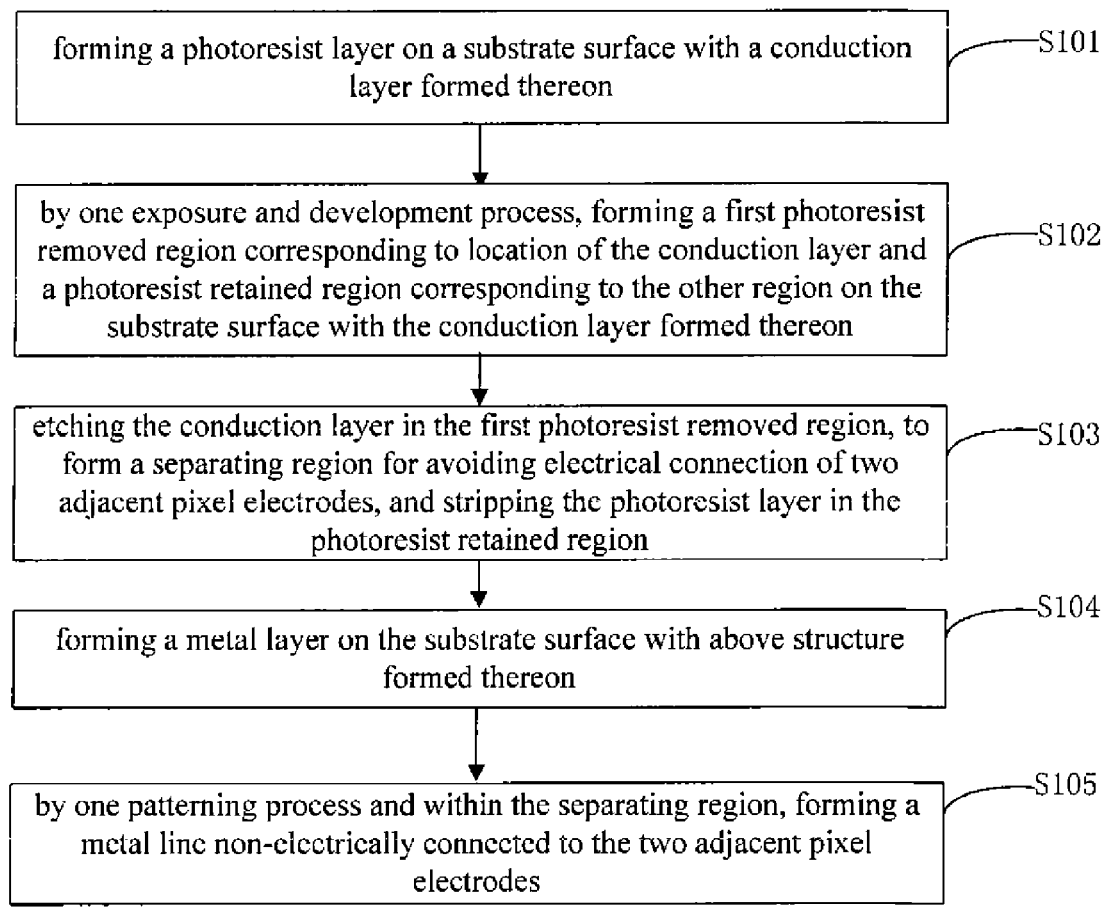
FIG. 2 is a flowchart illustrating the manufacturing method of an array substrate provided by an embodiment of the invention.
Figure 3:
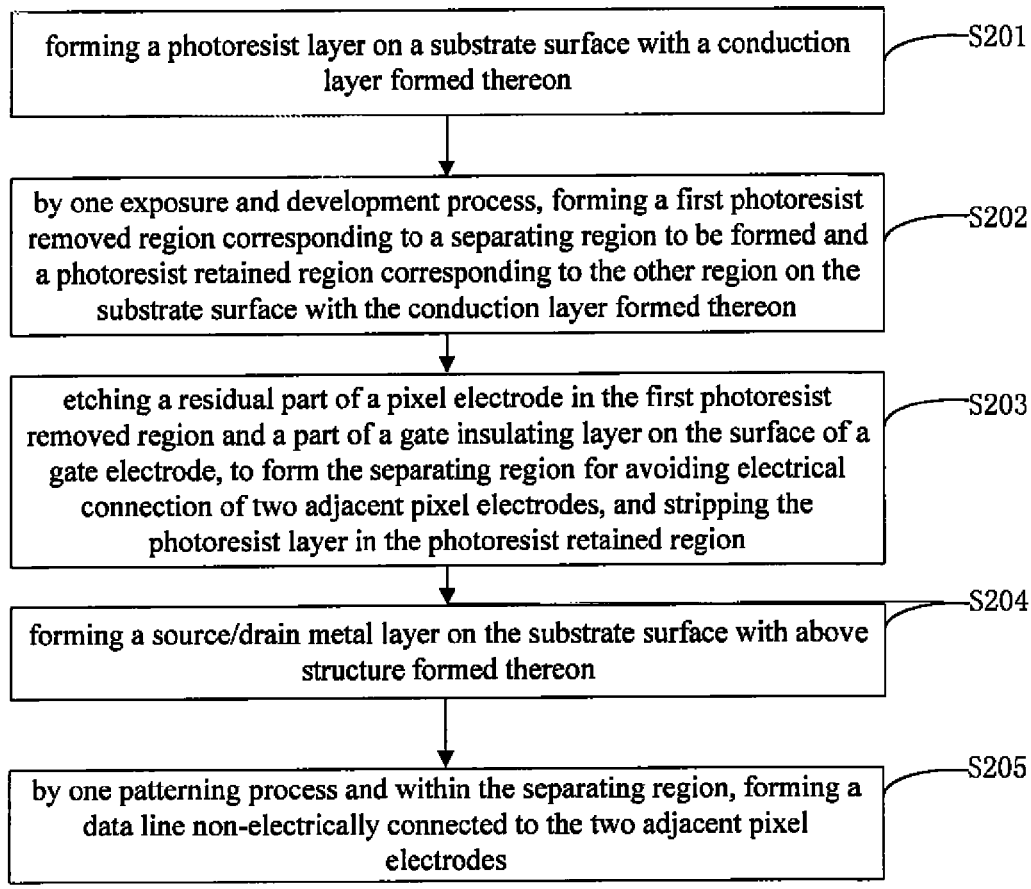
FIG. 3 is a flowchart illustrating the manufacturing method of another array substrate provided by an embodiment of the invention.

According to an embodiment of the invention, there is provided a manufacturing method of an array substrate, which may include a process for forming a plurality of pixel electrodes 104 arranged in the form of a matrix as shown in FIG. 1a. When the process for forming the above pixel electrodes 104 is adopted, a conduction layer 20 for electrically connecting two adjacent pixel electrodes 104 is also formed. As shown in FIG. 2, the manufacturing method of the array substrate may further include:

S101, a photoresist layer 30 is formed on a surface of a substrate with the conduction layer 20 formed thereon.

S102, through one exposure and development process, a first photoresist removed region A that corresponds to a location of the above conduction layer 20 and a photoresist retained region B that corresponds to the other region on the surface of the substrate with the conduction layer 20 formed thereon are formed.

S103, the conduction layer 20 in the first photoresist removed region A is etched, to form a separating region 106 useful for avoiding electrical connection of two adjacent pixel electrodes 104. And the photoresist layer in the photoresist retained region B is stripped.

S104, a metal layer is formed on a surface of the substrate with the above structures formed thereon.

S105, a metal line that is non-electrically connected to two adjacent pixel electrodes 104 is formed within the above separating region 106 through one patterning process. For example, it is possible that width of the separating region 106 is set to be larger than width of the metal line, to ensure that the metal line will not be electrically connected to pixel electrodes on its two sides.

Figure 1B:
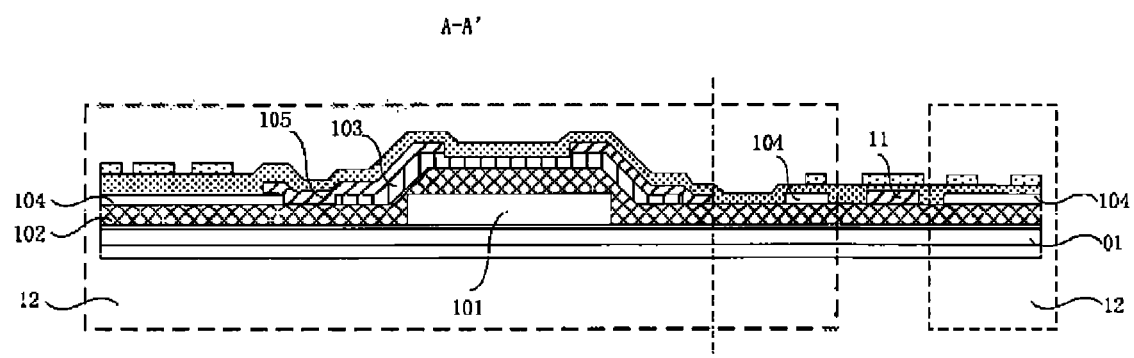
FIG. 1b is a schematic view illustrating the sectional structure of an array substrate.
Figure 1C:
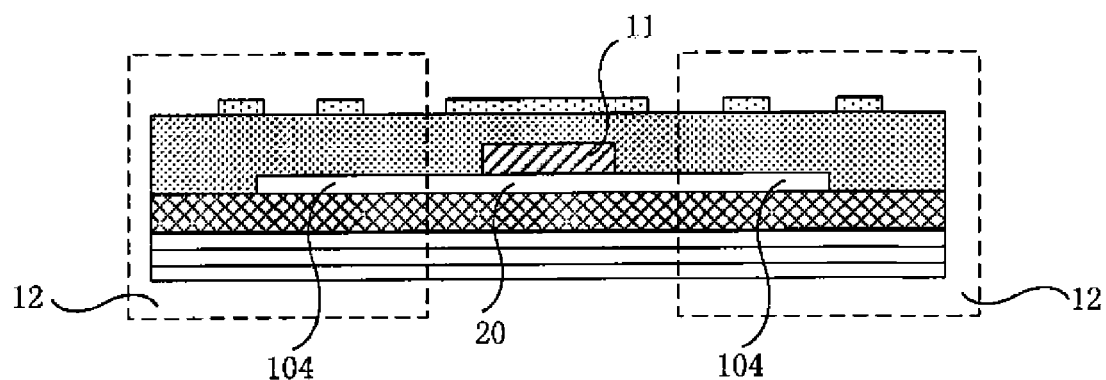
FIG. 1c is a structurally schematic view illustrating an array substrate with a conduction layer.
Figure 1D:
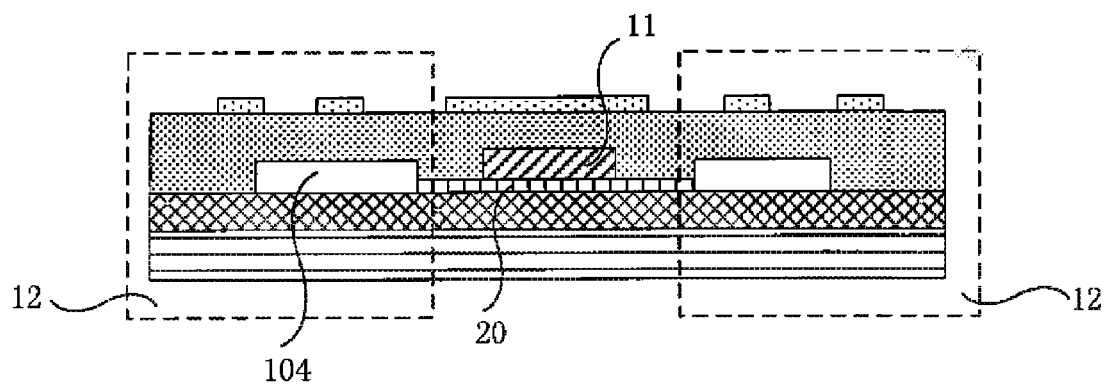
FIG. 1d is a structurally schematic view illustrating another array substrate with a conduction layer.

It is to be noted that, firstly, the above conduction layer 20 may be, as shown in FIG. 1c, constituted by a residual part of a pixel electrode 104; or, as shown in FIG. 1d, may also be constituted by a residual part of a semiconductor active layer 103; or, may also be constituted by a residual part of a pixel electrode 104 and a residual part of a semiconductor active layer 103.

There are many reasons for generation of the above residual parts. For example, during exposure and development, since a surface of the photoresist between two adjacent pixel units 12 is covered with dust, the photoresist cannot be exposed fully and a superfluous photoresist retained region is formed. Alternatively, since the defect of exposure process leads to incomplete exposure of a photoresist between two adjacent pixel units 12, a superfluous photoresist retained region is also formed. Also alternatively, since the defect of development process leads to incomplete removing of a photoresist between two adjacent pixel units 12 by development, a superfluous photoresist retained region is formed, and so on. On this basis, through a subsequent production process, the above residual parts will be formed between two adjacent pixel units 12.

Secondly, the above metal layer may include a gate metal layer for forming a gate line 10; or a source/drain metal layer 105 for forming a data line 11.

For example, as shown in FIG. 1a, each pixel unit 12 of the above array substrate may include one Thin Film Transistor (briefly called as TFT). The thin film transistor is a semiconductor unit having a switching characteristic, and for example, it may be, but not limit to, an amorphous silicon thin film transistor, a low temperature polysilicon thin film transistor, an oxide type thin film transistor, a thin film transistor of organic matter type, or the like.

The thin film transistor may be of top gate type, and may also be of bottom gate type, and there is no limit on it here. Top gate and bottom gate are defined relative to locations of the gate electrode 101 and the gate insulating layer 102.

For example, as shown in FIG. 1b, relative to a base substrate 01 (i.e. a transparent substrate), when a gate electrode 101 is close to the base substrate, and a gate insulating layer 102 is far away from the base substrate 01, it is a bottom-gate thin film transistor. In this case, because the metal layer is located on a surface of the gate insulating layer 102, but not on the side close to the base substrate 01, the metal layer may be a source/drain metal layer 105 for forming a data line 11.

For another example, when a gate electrode 101 is far away from the base substrate 01, and a gate insulating layer 102 is close to the base substrate, it is a top-gate thin film transistor. In this case, because the metal layer is located on a surface of the gate insulating layer 102, the metal layer may be a gate metal layer forming the gate electrode 101.

The following embodiments of the invention will each be described with reference to an example in which an array substrate has a bottom-type thin film transistor.

Thirdly, as regards a photoresist layer in embodiments of the invention, after it is subjected to exposure and development with a mask, a positive photoresist may be used for it, namely, the photoresist layer in an exposed region is removed during development, and the photoresist in an unexposed region is retained during the development. A negative photoresist may also be used for it, namely, the photoresist layer in an exposed region is retained during development, and the photoresist in an unexposed region is removed during the development. The present invention will not set a limit to this. For the following embodiments, each of them will be described with reference to a positive photoresist as an example in which a photoresist layer in an exposed region is removed during development, and the photoresist in an unexposed region is retained during development.

Fourthly, in the invention, a patterning process may indicate that it includes a photolithography process, or, it includes a photolithography process and an etching step, and besides, it may further include printing, inkjet and other process for forming a predetermined pattern. The photolithography process refers to such a process that includes film formation, exposure, development and other technological process and makes use of a photoresist, a mask, an exposing machine and so on to form a pattern. A corresponding patterning process may be selected in accordance with the formed structure in the invention. One-time patterning process in embodiments of the invention is described with reference to an example in which different exposed regions are formed by one mask exposure process, and then they are subjected to an iterative etching, ashing and/or other removal process, thereby obtaining the expected pattern at last.

According to embodiments of the invention, there is provided a manufacturing method of an array substrate, which includes a method of forming a plurality of pixel electrodes arranged in the form of a matrix on a base substrate. However, in virtue of the manufacturing process, transportation, storage or other factors, in the course of manufacturing pixel electrodes by using the above method, a conduction layer for electrically connecting two adjacent pixel electrodes may also be formed. In this way, pixel units in correspondence with the two adjacent pixel electrodes are electrically connected, and when one of the pixel units is controlled for display, a pixel unit adjacent and electrically connected to it is lit up as well, resulting in occurrence of an uncontrolled bright pixel point (bright dot defect). This adversely affects the display effects and the product quality.

Therefore, according to embodiments of the invention, based on the above manufacturing method, the following is further included. At first, a photoresist layer is formed on a surface of the substrate with the above structures formed thereon; and then, through one exposure and development process, a first photoresist removed region and a photoresist retained region are formed. The first photoresist removed region corresponds to a location of the conduction layer; and the photoresist retained region corresponds to the other region on the surface of the substrate with the conduction layer formed thereon. Next, the conduction layer in the first photoresist removed region is etched, to form a separating region for avoiding electrical connection of pixel electrodes of two adjacent pixel units, and a photoresist in the photoresist retained region is stripped. Then, a metal layer is formed on the surface of the substrate with the above structures formed thereon; and finally, a metal line that is non-electrically connected to two adjacent pixel electrodes is formed within the separating region through a patterning process. In this way, since the conduction layer is subjected to a cutting treatment, electrical connection between two adjacent pixel electrodes is avoided, and occurrence of bright dot defect is reduced. And, the above cutting treatment process is finished prior to formation of the metal line, and therefore, it will not bring about damage to and an effect on a thin film layer structure of the array substrate that is formed by a subsequent production process. Consequently, damage to excessive thin film layers in the array substrate in the course of reducing the bright dot defect can be avoided. The repair effect of the bright dot defect and the quality of products are enhanced.

Embodiment 1

Subsequent to the above step of forming the first photoresist removed region A and the photoresist retained region B through one exposure and development process, and prior to the above step of etching the conduction layer 20 in the first photoresist removed region A, the method may include:

the first photoresist removed region A corresponds a separating region 106 to be formed, and the photoresist retained region B corresponds to the other region on the surface of the substrate with the conduction layer 20 formed thereon.

Hereinafter, the manufacturing method of an array substrate with the separating region 106 formed thereon will be described in detail. As shown in FIG. 3 and FIGS. 4a to 4f, the method includes the following steps.

Figure 4A:
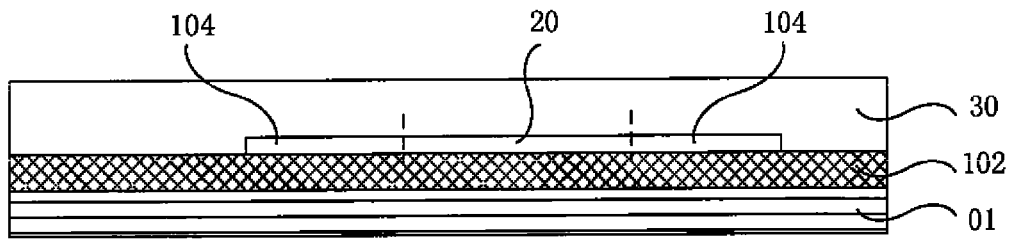
FIGS. 4a to 4f are structurally schematic views illustrating various stages in the manufacturing process of an array substrate provided by an embodiment of the invention.

S201, as shown in FIG. 4a, a photoresist layer 30 is formed on a surface of the substrate with the conduction layer 20 formed thereon (besides, the substrate further includes a gate electrode 101, a semiconductor active layer 103, which are not shown, and a pixel electrode 104 sequentially formed on a base substrate 01).

Figure 4B:
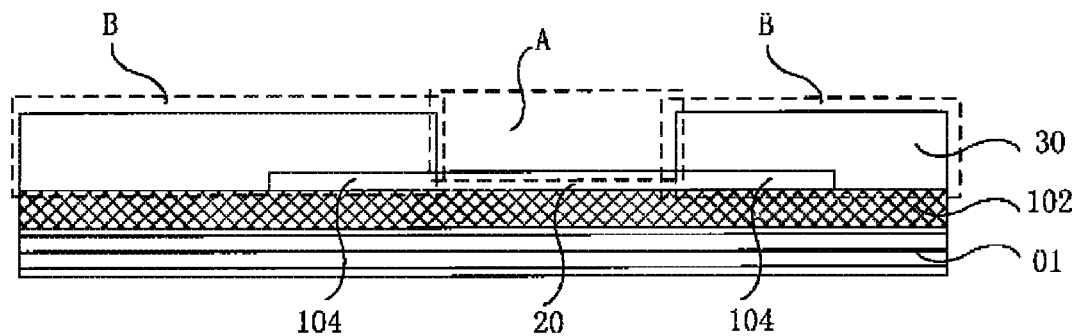

S202, as shown in FIG. 4b, through one exposure and development process, a first photoresist removed region A and a photoresist retained region B are formed. The first photoresist removed region A corresponds to a separating region 106 to be formed, and the photoresist retained region B corresponds to the other region on the surface of the substrate with the conduction layer 20 formed thereon, namely, it corresponds to other region on the surface of the substrate than the separating region.

Figure 4C:
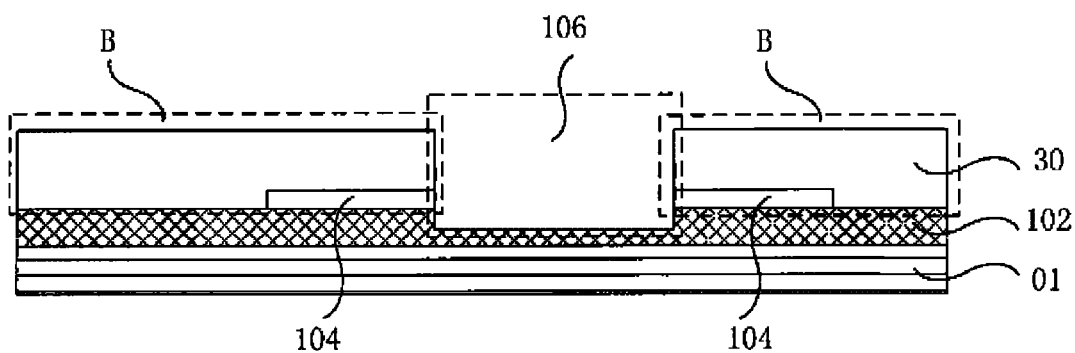
Figure 4D:
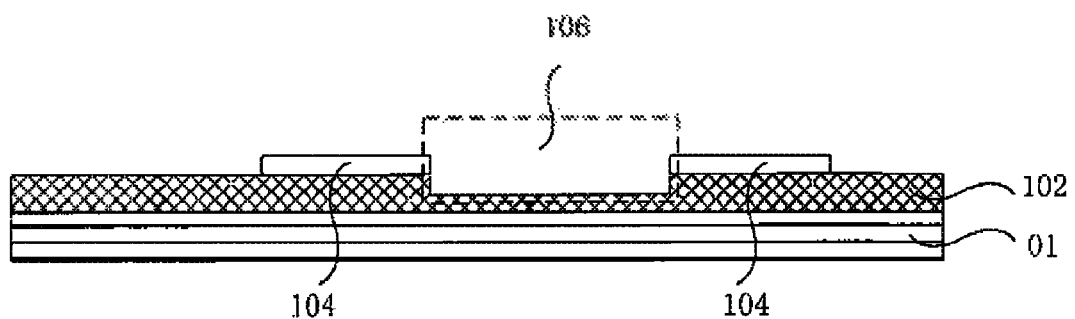

S203, as shown in FIG. 4c, a residual part of the pixel electrode 104 (the conduction layer 20) in the first photoresist removed region A and a part of a gate insulating layer 102 located on a surface of the gate electrode 101 in part are etched, to form the separating region 106 configured for avoiding electrical connection of two adjacent pixel electrodes 104; and as shown in FIG. 4d, the photoresist layer 30 in the above photoresist retained region B is stripped.

Figure 4E:
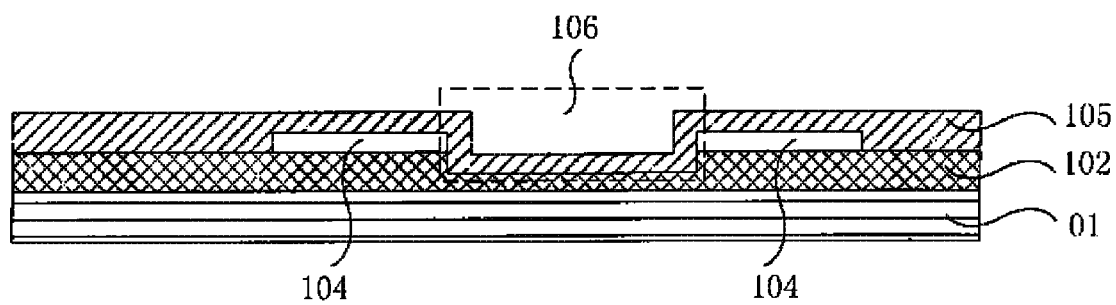

S204, as shown in FIG. 4e, a source/drain metal layer 105 (a metal layer) is formed on a surface of the substrate with the above structures formed thereon.

Figure 4F:
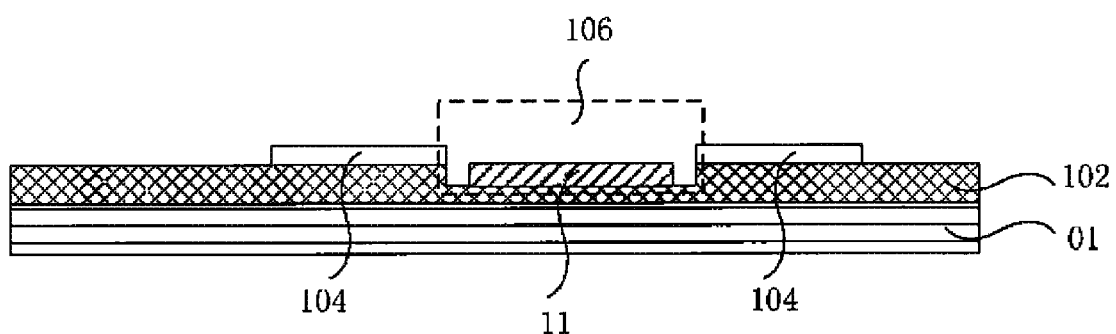
Figure 5:
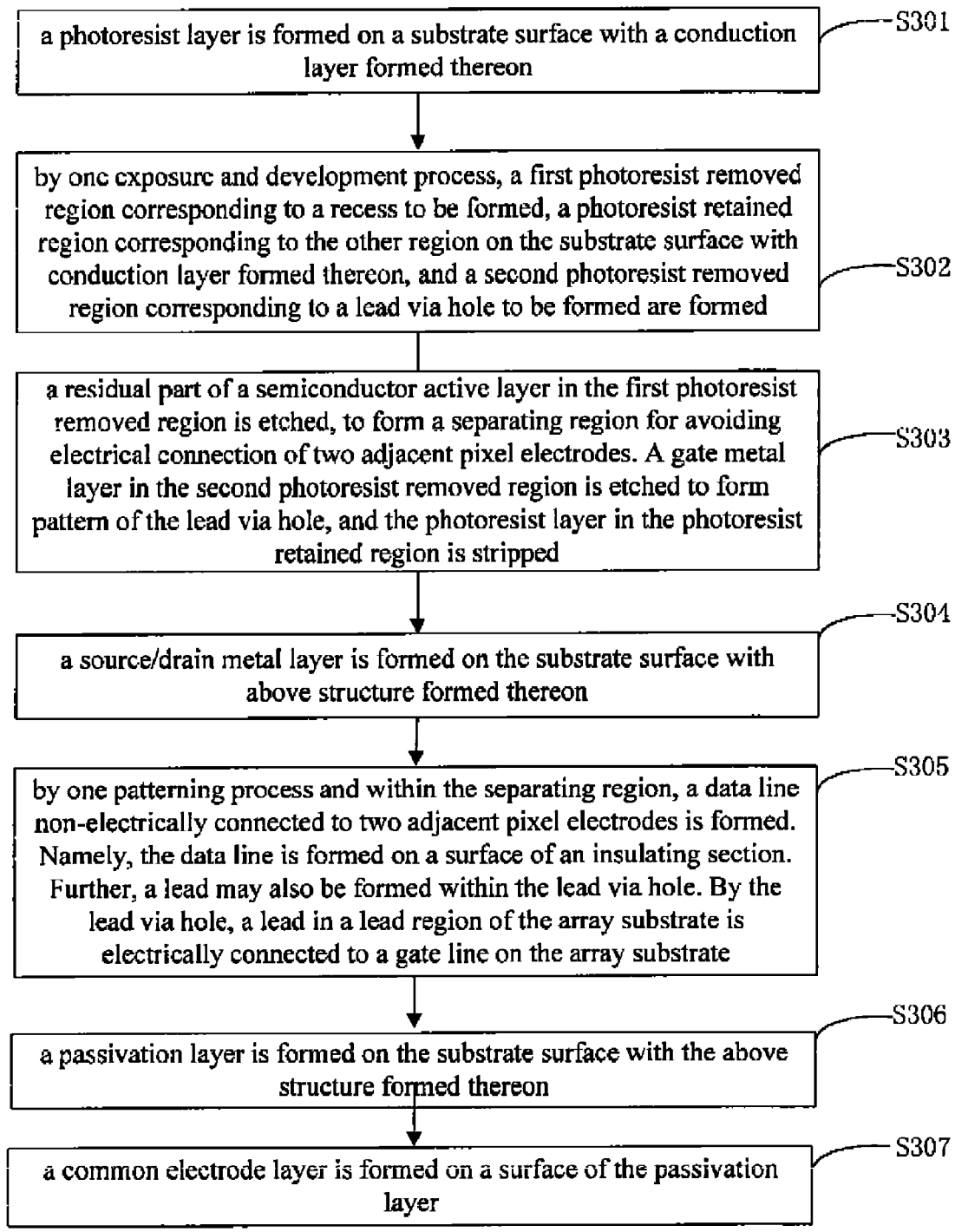
FIG. 5 is a flowchart illustrating the manufacturing method of still another array substrate provided by an embodiment of the invention.

S205, as shown in FIG. 4f, through one patterning process (for example, after coating of a photoresist, one mask exposure process is carried out, and then development, etching, stripping and other process are performed), a data line 11 (a metal line) that is non-electrically connected to the two adjacent pixel electrodes 104 is formed within the separating region 106.

It can be seen that, the conduction layer 20 (the residual part of the pixel electrode 104) within the above separating region 106 is fully removed. And, the data line 11 situated within the separating region 106 will not be electrically connected to any of the pixel electrodes 104 on its two sides.

In this way, it can be ensured that a data signal can be normally received by the data line 11, so that the array substrate can work normally, and damage to excessive thin film layers on the array substrate in the course of reducing the bright dot defect can also be avoided by the separating region 106.

It is to be noted that, firstly, in the above step S203, when the conduction layer 20 in the first photoresist removed region is etched, a part of the gate insulating layer is also etched. In this way, this allows the data line 11 and the pixel electrodes 104 located at both sides of it to have a certain step between them, and distances between the data line 11 and the pixel electrodes 104 are increased. Thus, signal crosstalk between the data line 11 and the pixel electrode 104 can be effectively avoided. Of course, when the metal layer adopts a gate metal layer, the signal crosstalk between a gate line 10 and a pixel electrode 104 can be effectively avoided likewise with the above scheme. In addition, those skilled in the art can take control of height of the step according to actual requirements. For example, in order to enhancing the effect of preventing signal crosstalk, height of the step may be set to be larger than or equal to thickness of the data line 11 or the gate line 10. Or, in order to reduce thickness of the display panel, height of the above step can be decreased. The present invention will not set a limit to this.

Secondly, the above embodiment has been described with reference to an example in which the conduction layer 20 is constituted by a residual part of the pixel electrode 104. When the conduction layer is constituted by a residual part of a semiconductor active layer, the similar result can be obtained. Details does not need to be provided here.

Embodiment 2

Subsequent to the above step of forming the first photoresist removed region A and the photoresist retained region B through one exposure and development process, and prior to the above step of etching the conduction layer 20 in the first photoresist removed region A, the method may include:

The first photoresist removed region A corresponds a recess 1061 to be formed, and the photoresist retained region B corresponds to the other region on the surface of the substrate with the conduction layer 20 formed thereon. That is, the photoresist retained region B corresponds to the other region on the surface of the substrate than the first photoresist removed region A. The separating region 106 to be formed includes two above-mentioned recesses 1061 and an insulating section 1062 located between two stated recesses 1062.

Hereinafter, the manufacturing method of an array substrate with the separating region 106 formed thereon will be described in detail. As shown in FIG. 5 and FIGS. 6a to 6h, the method includes the following steps.

Figure 6A:
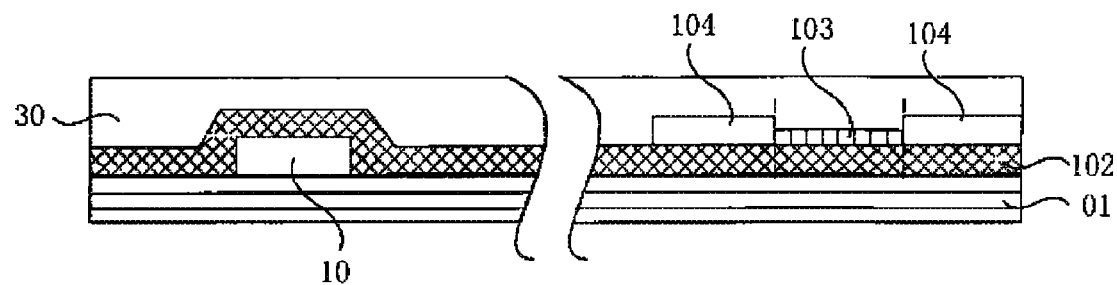
FIGS. 6a to 6h are structurally schematic views illustrating various stages in the manufacturing process of another array substrate provided by an embodiment of the invention.

S301, as shown in FIG. 6a, a photoresist layer 30 is formed on a surface of the substrate with the conduction layer 20 formed thereon (besides, the substrate further includes a gate electrode 101 (not shown), and a gate line 10, a gate insulating layer 102, a semiconductor active layer 103, and a pixel electrode 104 sequentially formed on a base substrate 01). In that case, the conduction layer 20 is formed by a residual part of the semiconductor active layer 103.

Figure 6B:
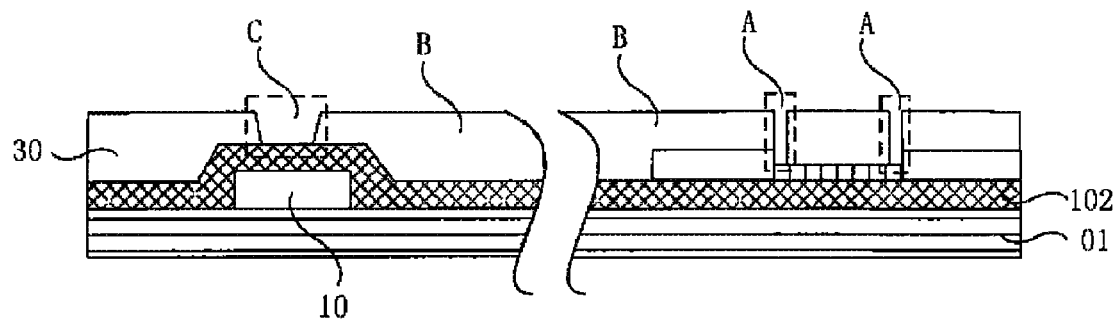

S302, as shown in FIG. 6b, through one exposure and development process, a first photoresist removed region A, a photoresist retained region B and a second photoresist removed region C are formed. The first photoresist removed region A corresponds to a recess 1061 to be formed, the second photoresist removed region C corresponds to a lead via hole 107 to be formed, and the photoresist retained region B corresponds to the other region on the surface of the substrate with the conduction layer 20 formed thereon. Namely, the photoresist retained region B corresponds to the other region on the surface of the substrate than the first photoresist removed region A and the second photoresist removed region C.

Figure 6C:
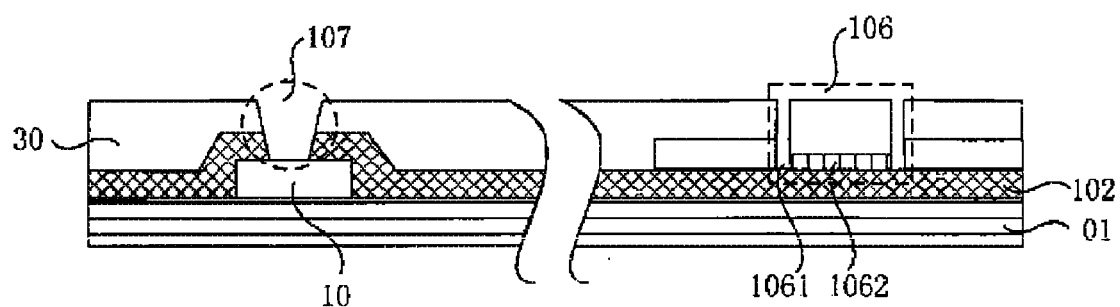

The separating region 106 to be formed includes two above-mentioned recesses 1061 and an insulating section 1062 located between the two stated recesses 1061, as shown in FIG. 6c.

Figure 6D:
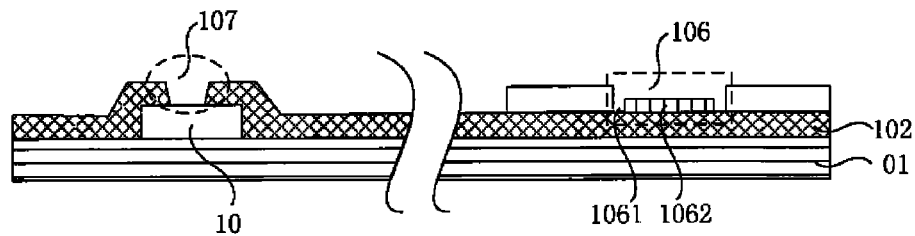

S303, as shown in FIG. 6c, a residual part of the semiconductor active layer 103 (the conduction layer 20) in the first photoresist removed region A is etched. The separating region 106 for avoiding electrical connection of two adjacent pixel electrodes 104 is formed. The gate insulating layer 102 in the second photoresist removed region C is etched, to form the above lead via hole 107. And as shown in FIG. 6d, the photoresist layer 30 in the above photoresist retained region B is stripped.

Figure 6E:
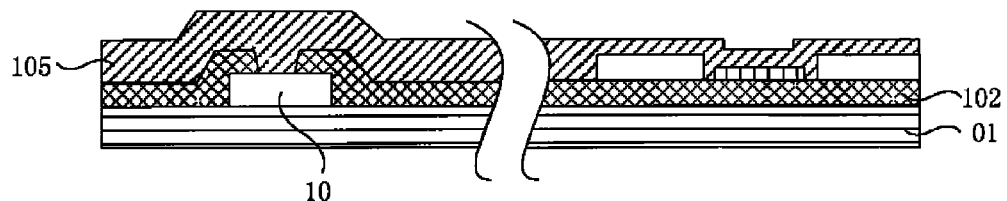

S304, as shown in FIG. 6e, a source/drain metal layer 105 (a metal layer) is formed on a surface of the substrate with the above structures formed thereon.

Figure 6F:
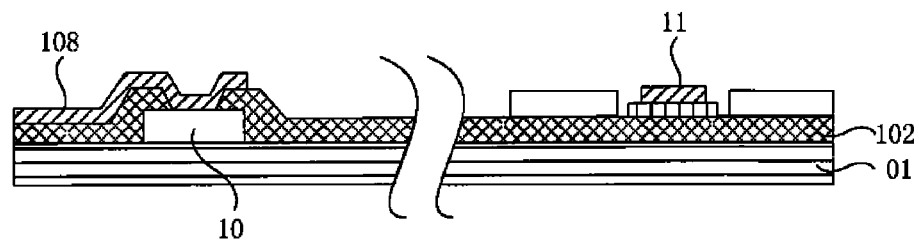

S305, as shown in FIG. 6f, through one patterning process (for example, after coating of a photoresist, one mask exposure process is carried out, and then development, etching, stripping and other process are performed), a data line 11 (a metal line) that is non-electrically connected to two adjacent pixel electrodes 104 is formed within the separating region 106. That is, the data line 11 is formed on a surface of the insulating section 1062. In addition, a lead 108 may also be formed within the lead via hole 107. Through the above lead via hole 107, the lead 108 situated in a lead region on the array substrate is electrically connected to the gate line 10 on the array substrate.

Figure 6G:
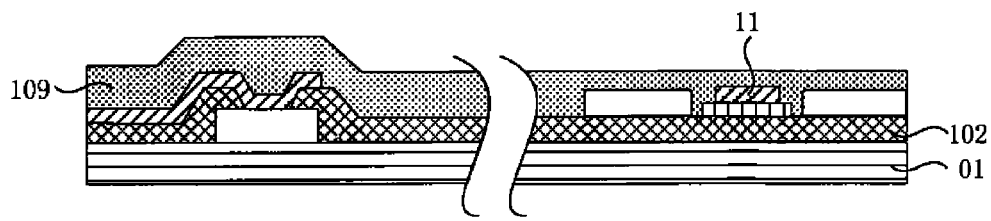
Figure 6H:
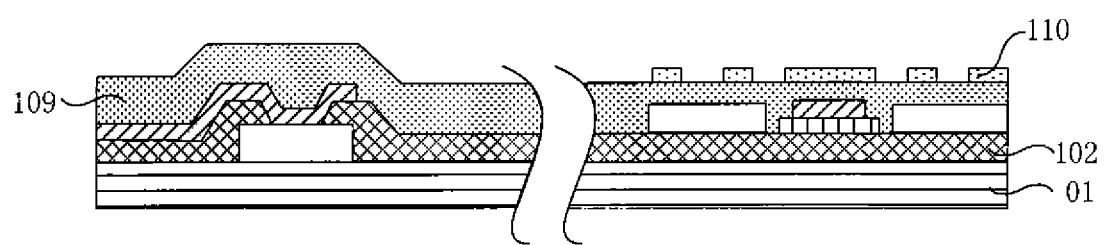

S306, as shown in FIG. 6g, on a surface of the substrate with the above structures formed thereon, a passivation layer 109 is formed.

S307, a common electrode layer 110 is formed on a surface of the passivation layer 109 through a patterning process.

It can be seen that, a part of the conduction layer 20 is fully removed with the aid of two recesses 1061 of the above separating region 106, so that two adjacent pixel electrodes 104 are in a non-electrically connected state. And, the data line 11 is situated on a surface of the insulating section 1062 at the separating region 106, and will not be electrically connected to any of the pixel electrodes 104 on its two sides. In this way, it can be ensured that a data signal can be normally received by the data line 11, so that the array substrate can work normally, and damage to excessive thin film layers on the array substrate in the course of reducing the bright dot defect can also be avoided by the separating region 106.

It is to be noted that, firstly, in the scheme of the above embodiment, manufacture of the lead via hole 107 can be accomplished during forming recesses 1061, and so production process can be simplified. And the method is also suitable for Embodiment 1.

Secondly, in the scheme provided by Embodiment 2, pixel electrodes 104 and the common electrode layer 110 are disposed on different layers. The common electrode layer 110 located at the top of the array substrate may be in a slit shape, while pixel electrodes 104 close to the base substrate 01 may be in a planar shape. A display apparatus formed by using the above array substrate is an AD-SDS (Advanced- Super Dimensional Switching, briefly called as ADS) mode display apparatus. In the AD-SDS technology, a multi-dimensional electric field is formed by parallel electric fields produced at edges of the common electrode layers within the same plane and a longitudinal electric field produced between a pixel electrode 104 and a common electrode layer 110, so as to allow liquid crystal molecules with every alignment within a liquid crystal cell, which are located directly above the electrode and between the pixel electrodes, to be rotated and switched, and thereby the work efficiency of planar-oriented liquid crystals is enhanced and the transmissive efficiency is increased. Likewise, the manufacturing method of the common electrode layer 110 is also suitable for Embodiment 1.

Furthermore, in Embodiment 1 and Embodiment 2, when the common electrode layer 110 is produced on a color filter substrate cell-aligned with the array substrate, the formed display apparatus is a TN (Twist Nematic) mode display apparatus. The difference lies in that, as regards the TN mode display apparatus, which is a liquid crystal display with the principle of vertical electric field, liquid crystals in a nematic mode are driven by a vertical electrical field formed between the common electrode layer 110 on the color filter substrate and a pixel electrode 104 on the array substrate. TN mode display apparatus s have the merit of large aperture ratio, but have the drawback of narrow viewing angle of about 90 degrees. For those skilled in the art, they can make selection for setting of the common electrode layer 110 according to actual requirements.

Thirdly, the above embodiment has been described with reference to an example in which the conduction layer 20 is constituted by a residual part of the semiconductor active layer 103. When the conduction layer 20 is constituted by a residual part of a pixel electrode 104, the similar result can be obtained. Details does not need to be described here.

Fourthly, when separating regions 106 in Embodiment 1 and Embodiment 2 are compared, it can be seen that in Embodiment 1, upon production of the separating region 106, a majority of the conduction layer 20 needs to be etched, so that the etch time is long, but the requirement on the etch precision is low, and the effect of preventing electrical connection of two adjacent pixel electrodes 104 is good. While in Embodiment 2, upon production of the separating region 106, only a small part of the conduction layer 20 needs to be etched to form recesses 1061, so that the etch speed is fast, but the requirement on the etch precision is high, and the effect of preventing electrical connection of two adjacent pixel electrodes 104 is lower than that of Embodiment 1. Thus, those skilled in the art can make selection for the scheme of producing a separating region 106 according to actual requirements.

Further, the width range of the above separating regions 106 may be 12 μm to 20 μm. In this way, it can be ensured that there is a sufficient wiring space for the metal line (the data line 11 or the gate line 10), to avoid occurrence of an undesirable phenomenon of signal crosstalk between it and pixel electrodes 104 located on its two sides.

According to an embodiment of the invention, there is provided an array substrate, as shown in FIG. 1a, which includes a plurality of pixel electrodes 104 arranged in the form of a matrix. It further includes: a separating region 106 configured for avoiding electrical connection of two adjacent pixel electrodes 104; and a metal line that is situated within the separating region and is non-electrically connected to two adjacent pixel electrodes 106.

According to an embodiment of the invention, there is provided an array substrate, which includes a plurality of pixel electrodes arranged in the form of a matrix, and which further includes a separating region configured for avoiding electrical connection of two adjacent pixel electrodes; and a metal line that is situated within the separating region and is non-electrically connected to two adjacent pixel electrodes. In this way, even if the conduction layer for electrically connecting two adjacent pixel electrodes that is formed in the course of manufacturing pixel electrodes results in electrical connection of pixel units corresponding to two adjacent pixel electrodes in virtue of the manufacturing process, transportation, storage or other factors, when one of the pixel units is controlled for display, a pixel unit adjacent and electrically connected to it is lit up as well, resulting in occurrence of an uncontrolled bright pixel point (bright dot defect). This adversely affects the display effects and the product quality. According to embodiments of the invention, a cutting treatment can be conducted on the conduction layer with the aid of the separating region, so that electrical connection between two adjacent pixel electrodes can be avoided, and occurrence of bright dot defect is reduced. And, arrangement of the separating region is finished prior to manufacture of the metal line, and therefore, it will not damage or have an effect on a thin film layer structure of the array substrate that is formed by a subsequent production process. Consequently, damage to excessive thin film layers on the array substrate in the course of reducing the bright dot defect can be avoided. The repair effect of the bright dot defect and the quality of products are enhanced.

For example, the separating region 106 may be the case shown in FIG. 4c, where the conduction layer 20 (the residual part of a pixel electrode) within the separating region 106 is fully removed, and only a metal line (e.g. a data line 11) is provided within the separating region 106. And, the data line 11 situated within the separating region 106 will not be electrically connected to any of the pixel electrodes 104 on its two sides. In this way, it can be ensured that a data signal can be normally received by the data line 11, so that the array substrate can work normally, and damage to excessive thin film layers on the array substrate in the course of reducing the bright dot defect can also be avoided by the separating region 106.

For example, the separating region 106 may be the case shown in FIG. 6d, where the separating region 106 includes two recesses 1061 and an insulating section 1062 located between the two recesses 1061, and a metal line (e.g. a data line 11) is located on a surface of the insulating section 1062. It can be seen that, a part of the conduction layer 20 is fully removed with the aid of two recesses 1061 of the above separating region 106, so that two adjacent pixel electrodes 104 lie in a non-electrically connected state, and, the data line 11 is situated on a surface of the insulating section 1062 at the separating region 106, and will not be electrically connected to any of the pixel electrodes 104 on its two sides. In this way, it can be ensured that a data signal can be normally received by the data line 11, so that the array substrate can work normally, and damage to excessive thin film layers on the array substrate in the course of reducing the bright dot defect can also be avoided by the separating region 106.

According to an embodiment of the invention, there is provided a display apparatus, which includes any of array substrates as stated above. It has the same beneficial effects as the array substrate in the foregoing embodiments. Since the detailed structure and beneficial effects of the array substrate have been described in detail in the foregoing embodiments, details do not need to be repeated here.

In embodiments of the invention, the display apparatus may include a liquid crystal display apparatus. For example, the display apparatus may be a liquid crystal display, a liquid crystal television, a digital photo frame, a cell phone, a watch, a tablet computer, a notebook computer, a navigator or any other product or component having a display function.

Descriptions made above are merely specific embodiments of the invention, but the protection scope of the invention is not limited thereto. Changes or replacements, as easily conceivable by those skilled in the art within the technical scope disclosed by the invention, shall be encompassed within the protection scope of the invention. Therefore, the protection scope of the invention shall be determined by the protection scope of attached claims.

This application claims the benefit of priority from Chinese patent application No. 201410472064.1, filed on Sep. 16, 2014, the disclosure of which is incorporated herein in its entirety by reference as a part of the present application.

What is claimed is:

1. A method for manufacturing an array substrate, comprising a process for forming a plurality of pixel electrodes arranged in the form of a matrix, with a conduction layer for electrically connecting two adjacent pixel electrodes being formed upon formation of the pixel electrodes,
the method further comprising:
forming a photoresist layer on a surface of a substrate with the conduction layer formed thereon;
through one exposure and development process, forming a first photoresist removed region that corresponds to a location of the conduction layer and a photoresist retained region that corresponds to other region on the surface of the substrate with the conduction layer formed thereon;
etching the conduction layer in the first photoresist removed region, to form a separating region for avoiding electrical connection of two adjacent pixel electrodes; and stripping the photoresist layer in the photoresist retained region;
forming a metal layer on the surface of the substrate with above structures formed thereon;
through one patterning process and within the separating region, forming a metal line that is non-electrically connected to two adjacent pixel electrodes.

2. The method according to claim 1, wherein the method comprises, after the forming of the first photoresist removed region and the photoresist retained region through one exposure and development process, and before the etching of the conduction layer in the first photoresist removed region,
the first photoresist removed region corresponds to the separating region to be formed, and the photoresist retained region corresponds to other region on the surface of the substrate with the conduction layer formed thereon.

3. The method according to claim 2, the method further comprising, after the forming of the metal line at the location corresponding to the separating region through the patterning process,
forming a passivation layer on the surface of the substrate with above structures formed thereon;
forming a common electrode layer on a surface of the passivation layer.

4. The method according to claim 1, wherein the method comprises, after the forming of the first photoresist removed region and the photoresist retained region through one exposure and development process, and before the etching of the conduction layer in the first photoresist removed region,
the first photoresist removed region corresponds to a recess to be formed, the photoresist retained region corresponds to other region on the surface of the substrate with the conduction layer formed thereon; the separating region to be formed includes two recesses as stated and an insulating section located between the two recesses.

5. The method according to claim 4, the method further comprising, after the forming of the metal line at the location corresponding to the separating region through the patterning process,
forming a passivation layer on the surface of the substrate with above structures formed thereon;
forming a common electrode layer on a surface of the passivation layer.

6. The method according to claim 1, wherein, the metal layer comprises a gate metal layer or a source/drain metal layer.

7. The method according to claim 1, wherein, in the event that the array substrate comprises a gate insulating layer, upon etching the conduction layer in the first photoresist removed region, a part of the gate insulating layer is etched.

8. The method according to claim 7, the method further comprising, after the forming of the metal line at the location corresponding to the separating region through the patterning process,
forming a passivation layer on the surface of the substrate with above structures formed thereon;
forming a common electrode layer on a surface of the passivation layer.

9. The method according to claim 1, the method further comprising, during the forming of the first photoresist removed region and the photoresist retained region through one exposure and development process,
forming a second photoresist removed region, which corresponds to a lead via hole to be formed;
etching the gate insulating layer in the second photoresist removed region, to form the lead via hole.

10. The method according to claim 1, the method further comprising, after the forming of the metal line at the location corresponding to the separating region through the patterning process,
forming a passivation layer on the surface of the substrate with above structures formed thereon;
forming a common electrode layer on a surface of the passivation layer.

11. The method according to claim 10, wherein, the width range of the separating region is 12 µm to 20 µm.

12. The method according to claim 1, wherein the first photoresist removed region corresponds to the separating region to be formed, and the photoresist retained region corresponds to other region on the surface of the substrate with the conduction layer formed thereon.

13. The method according to claim 1, wherein the first photoresist removed region corresponds to a recess to be formed, the photoresist retained region corresponds to other region on the surface of the substrate with the conduction layer formed thereon; the separating region to be formed includes two recesses as stated and an insulating section located between the two recesses.

14. An array substrate, comprising a plurality of pixel electrodes arranged in the form of a matrix, a separating region configured for avoiding electrical connection of two adjacent pixel electrodes, and a metal line that is situated within the separating region and is non-electrically connected to the two adjacent pixel electrode, wherein the metal line is of a data line, the array substrate further comprises a passivation layer and a thin film transistor (TFT) comprising a source electrode, a drain electrode, and the metal line, and the metal line is located at a same layer with the drain electrode and the source electrode, and is located beneath the passivation layer.

15. The array substrate according to claim 14, wherein, only the metal line is provided within the separating region.

16. A display apparatus, comprising the array substrate according to claim 14.

17. The display apparatus according to claim 16, wherein, only the metal line is provided within the separating region.

18. The display apparatus according to claim 16, wherein, the separating region includes two recesses, and an insulating section located between the two recesses, and the metal line is located on a surface of the insulating section.

19. The array substrate according to claim 14, wherein the separating region includes two recesses, and an insulating section located between the two recesses, and the metal line is located on a surface of the insulating section.

* * * * *